(12) United States Patent
Kanaya

(10) Patent No.: US 11,581,462 B2
(45) Date of Patent: Feb. 14, 2023

(54) DISPLAY DEVICE WITH METAL LAYER WITH UNEVEN SURFACE

(71) Applicant: Japan Display Inc., Tokyo (JP)

(72) Inventor: Yasuhiro Kanaya, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 17/005,629

(22) Filed: Aug. 28, 2020

(65) Prior Publication Data

US 2021/0066564 A1 Mar. 4, 2021

(30) Foreign Application Priority Data

Aug. 29, 2019 (JP) .............................. JP2019-157392

(51) Int. Cl.
*H01L 33/00* (2010.01)
*H01L 33/62* (2010.01)
*H01L 33/60* (2010.01)
*H01L 25/075* (2006.01)

(52) U.S. Cl.
CPC .......... *H01L 33/62* (2013.01); *H01L 25/0753* (2013.01); *H01L 33/60* (2013.01); *H01L 2933/0083* (2013.01)

(58) Field of Classification Search
CPC ..... H01L 33/62; H01L 33/60; H01L 25/0753; H01L 2933/0083; H01L 27/156; H01L 21/76895; G09F 9/33
See application file for complete search history.

(56) References Cited

U.S. PATENT DOCUMENTS

| 2013/0299808 | A1 | 11/2013 | Sugimoto et al. | |
| 2014/0016054 | A1* | 1/2014 | Kim | H01L 29/786 349/42 |
| 2014/0077249 | A1* | 3/2014 | Cho | H01L 33/483 257/99 |
| 2014/0346449 | A1* | 11/2014 | Choi | H01L 27/3258 438/23 |
| 2019/0252576 | A1 | 8/2019 | Lee et al. | |
| 2019/0280061 | A1* | 9/2019 | Joo | H01L 51/5221 |
| 2020/0373366 | A1* | 11/2020 | Sim | H01L 27/3258 |
| 2021/0296615 | A1* | 9/2021 | Lee | H01L 27/3244 |

FOREIGN PATENT DOCUMENTS

| JP | 2008234928 A | 10/2008 |
| KR | 10-2014-0136840 | 12/2014 |
| KR | 10-2019-0098291 | 8/2019 |
| TW | 201240076 | 10/2012 |

OTHER PUBLICATIONS

Korean Office Action dated Feb. 27, 2022 in corresponding Korean Application No. 10-2020-0102250.

* cited by examiner

*Primary Examiner* — Ismail A Muse
(74) *Attorney, Agent, or Firm* — K&L Gates LLP

(57) ABSTRACT

A display device includes a substrate, an interlayer insulating layer over the substrate, a metal layer over the interlayer insulating layer, and a light emitting element over the metal layer. The interlayer insulating layer includes a plurality of a first depressed portions. The metal layer includes a first region bonding to the light emitting element and a second region surrounding the first region. The second region, a plurality of second depressed portions is provided along the plurality of first depressed portions.

14 Claims, 20 Drawing Sheets

11

DISPLAY DEVICE WITH METAL LAYER WITH UNEVEN SURFACE

CROSS REFERENCE TO RELATED APPLICATIONS

This application is based on and claims the benefit of priority from the prior Japanese Patent Application No. 2019-157392, filed on Aug. 29, 2019, the entire contents of which are incorporated herein by reference.

FIELD

The present invention relates to a display device, in particular, a display device using micro LEDs and a method of manufacturing a display device.

BACKGROUND

In small and medium-sized displays such as smart phones, displays using a liquid crystal or an OLED (Organic Light Emitting Diode) have been commercialized. In particular, an OLED display using the OLED, which is a self-luminous element, has the advantages of high-contrast and no need for backlight, as compared with a liquid crystal display. However, since the OLED is composed of organic compounds, it is difficult to secure high reliability of the OLED display due to deterioration of the organic compounds.

On the other hand, as a next-generation display, a so-called micro LED display in which pixels are arranged in a matrix and minute micro LEDs are arranged in each of the pixels has been developed. The micro LED is a self-luminous element similar to the OLED, but unlike OLED, the micro LED is composed of stable inorganic compounds containing gallium (Ga) or indium (In), and therefore, the micro LED display is easy to secure high reliability as compared with the OLED display. In addition, the micro LED can achieve high light emission efficiency and high brightness. Therefore, the micro LED display is expected as a next-generation display with high reliability, high brightness, and high contrast.

Similar to common LEDs, the micro LEDs are formed over a substrate such as sapphire, and are separated into individual micro LEDs by dicing the substrate. As described above, in the micro LED display, the diced micro LEDs are disposed in the pixels of a display substrate.

The micro LED located in a pixel emit light not only from the top surface of the micro LED corresponding to the display surface of the display, but also from the side and the bottom surfaces of the micro LED. If not only the light emitted from the top surface but also the light emitted from the side surface or the bottom surface can be utilized, the light emission efficiency of the micro LED display can be improved. For example, in the OLED, there is known a method for improving the light extraction efficiency of an OLED display by providing an uneven reflective layer under a light emitting element (for example, in reference to Japanese Patent Application Laid-Open No. 2008-234928).

SUMMARY

A display device according to an embodiment of the present invention includes a substrate, an interlayer insulating layer over the substrate, a metal layer over the interlayer insulating layer, and a light emitting element over the metal layer. The interlayer insulating layer includes a plurality of first depressed portions. The metal layer includes a first region bonding to the light emitting element and a second region surrounding the first region. In the second region, a plurality of second depressed portions is provided along the plurality of first depressed portions.

A display device according to an embodiment of the present invention includes a substrate, an interlayer insulating layer over the substrate a metal layer over the interlayer insulating layer, and a light emitting element over the metal layer. The interlayer insulating layer includes a plurality of first projection portions. The metal layer includes a first region bonding to the light emitting element and a second region surrounding the first region. In the second region, a plurality of second projection portions is provided along the plurality of first projection portions.

A display device according to an embodiment of the present invention includes a substrate, an interlayer insulating layer over the substrate, a metal layer over the interlayer insulating layer, and a light emitting element over the metal layer The interlayer insulating layer includes a plurality of first grooves. The metal layer includes a first region bonding to the light emitting element and a second region surrounding the first region. In the second region, a plurality of second grooves is provided along the plurality of first grooves.

DESCRIPTION OF EMBODIMENTS

Figure 1:
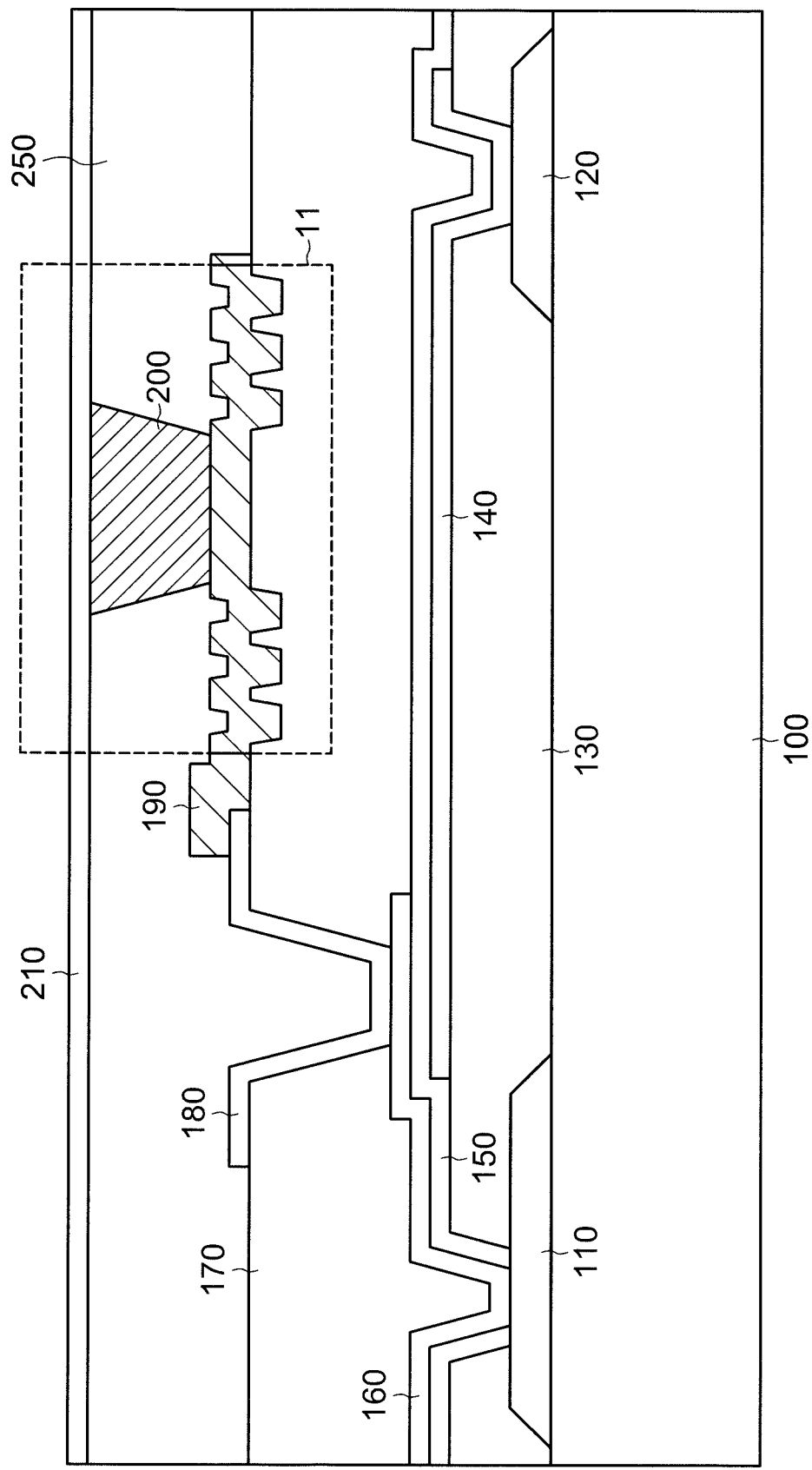
FIG. 1 is a schematic cross-sectional view of a display device according to an embodiment of the present invention.

Since the micro LED contains many layers of a high refractive index material, many lights is emitted from the side surface of the micro LED. Therefore, it is necessary to use the light emitted from the side surface of the micro LED to improve the efficiency of light extraction from the display surface of the display device.

In view of the above problems, it is an object of the present invention to provide a display device having a structure with high light extraction efficiency from a display surface.

Hereinafter, embodiments of the present invention are described with reference to the drawings. Each of the embodiments is merely an example, and a person skilled in the art can easily conceive of the invention by appropriately changing the embodiment while maintaining the gist of the invention, and the embodiment is naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

The expressions "a includes A, B or C", "a includes any of A, B and C", "α includes one selected from the group consisting of A, B and C", and "α includes one selected from the group consisting of A, B and C" do not exclude the case where α includes a plurality of combinations of A to C unless otherwise specified. Furthermore, these expressions do not exclude the case where α includes other elements.

In this specification, the phrase "above" or "above direction" or "below" or "below direction" is used for convenience of the explanation, but in principle, the direction from a substrate toward the structure is referred to as "above" or "above direction" with reference to a substrate in which the structure is formed. Conversely, the directions from the structures to the substrate are "below" or "below direction". Therefore, in the representation of the light emitting element over the substrate, the light emitting element surface facing the substrate is the bottom surface of the light emitting element and the other surface is the top surface of the light emitting element. The expression "the light emitting element over the substrate" only explains the vertical relationship between the substrate and the light emitting element, and an another member may be placed between the substrate and the light emitting element. Furthermore, the terms "above" or "above direction" or "below" or "below direction" mean the order of stacked layer in the construction in which a plurality of layers are stacked layer, and may not be related to the position superimposed in planar view.

In this specification, "display device" is intended to include a wide range of devices that display images using the light emitting element, and may include not only display panels and display modules but also devices to which other optical members (e.g., polarized member, backlights, touch panels, etc.) are attached.

The following embodiments may be combined with each other as long as there is no technical contradiction.

First Embodiment

Figure 2A:
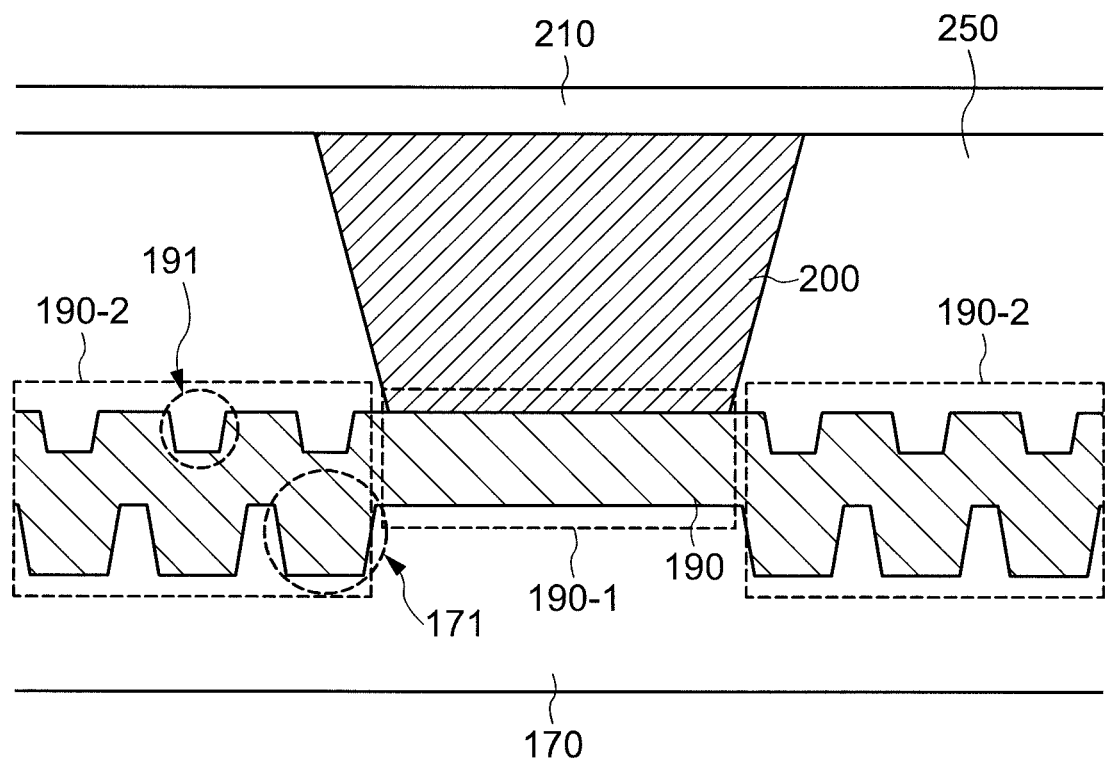
FIG. 2A is a schematic partial enlarged view of a display device according to an embodiment of the present invention.
Figure 2B:
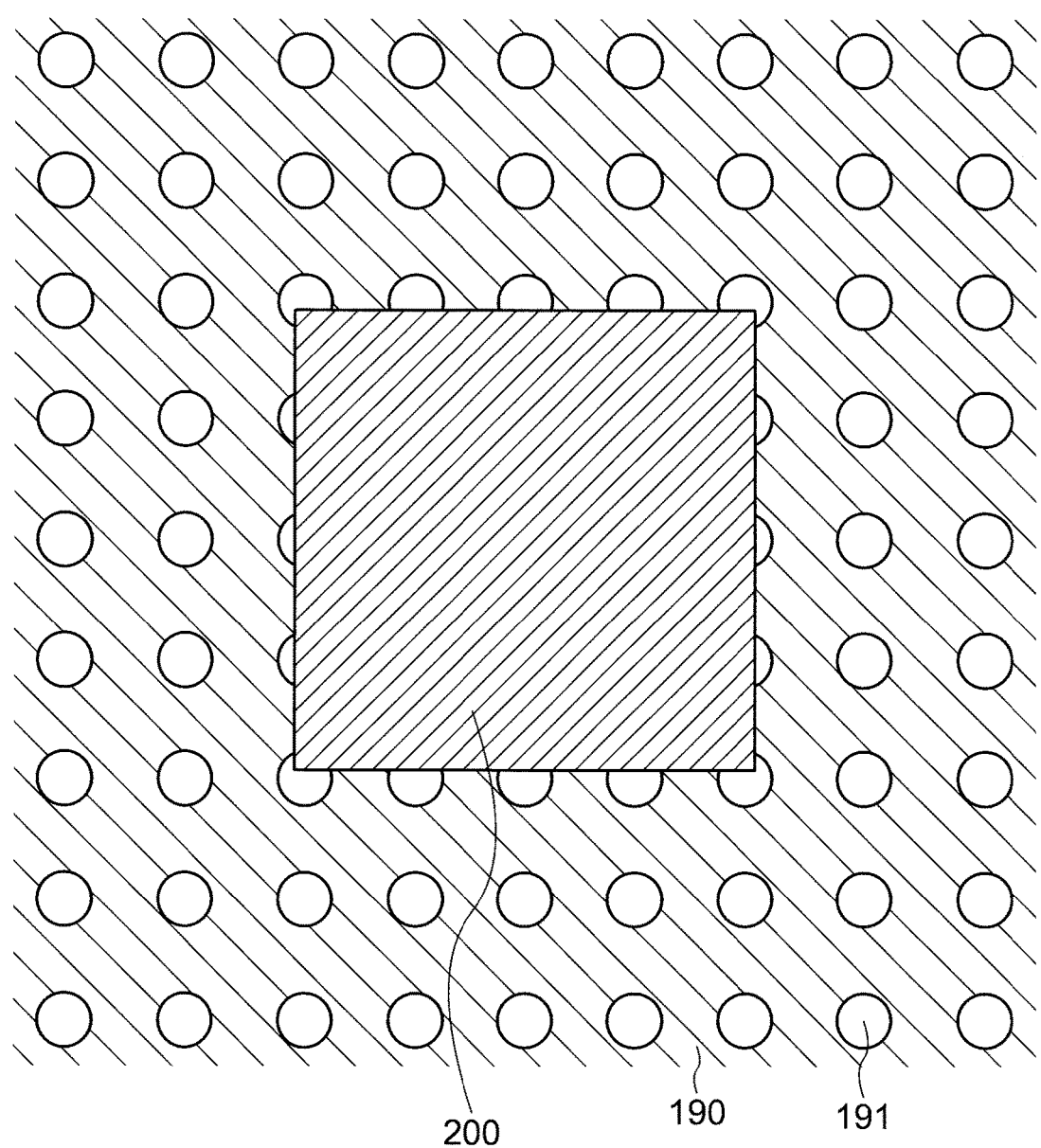
FIG. 2B is a schematic plane view of a display device according to an embodiment of the present invention.
Figure 2C:
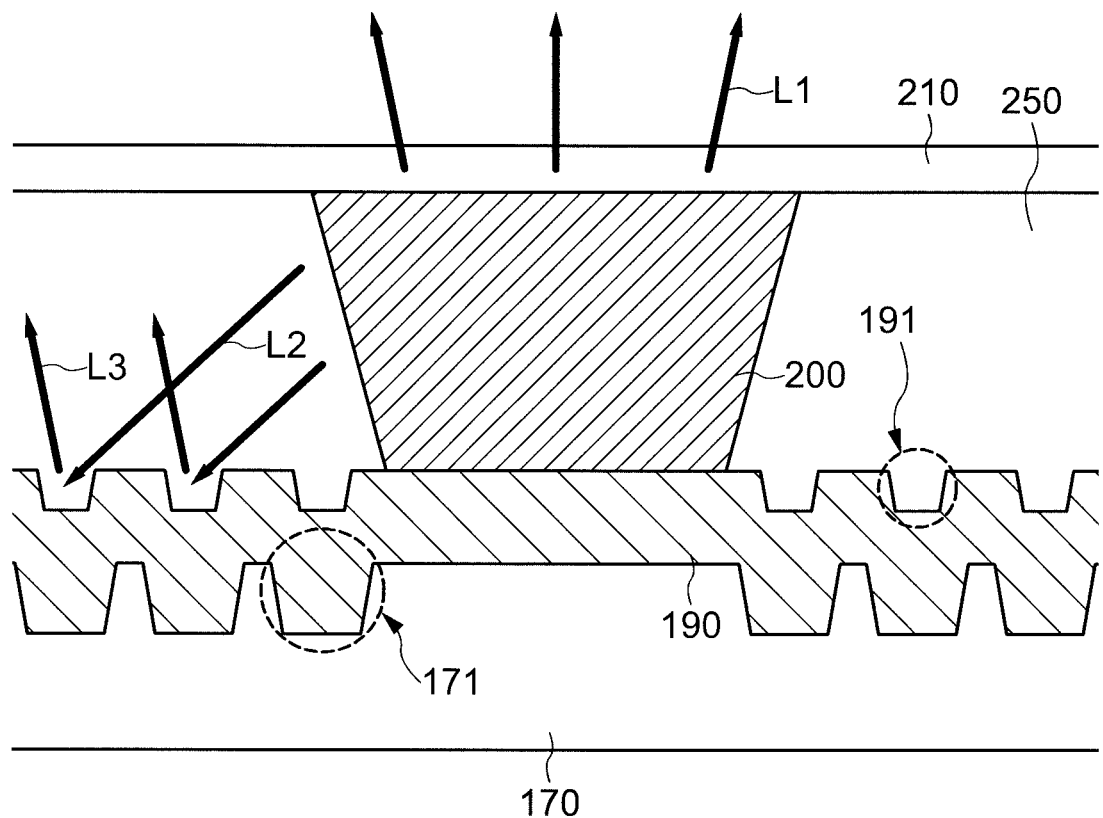
FIG. 2C is a schematic partial enlarged view of a display device according to an embodiment of the present invention.

Referring to FIGS. 1 to 2C, a display device 10 according to an embodiment of the present invention are described.

[Configuration of Display Device 10]

FIG. 1 is a schematic cross-sectional view of a display device 10 according to an embodiment of the present invention. Specifically, FIG. 1 is a cross-sectional view cut to include a pixel of the display device 10.

As shown in FIG. 1, the display device 10 includes a substrate 100, a first wiring layer 110, a second wiring layer 120, a first insulating layer 130, a second conductive layer 140, a second insulating layer 150, a first conductive layer 160, a interlayer insulating layer 170, a first connection electrode 180, a metal layer 190, a light emitting element 200, and a second connection electrode 210.

On the substrate 100, the first wiring layer 110 and the second wiring layer 120 are provided. On the first wiring layer 110 and the second wiring layer 120, the first insulating layer 130, the second conductive layer 140, the second insulating layer 150, and the first conductive layer 160 are stacked in this order. On the first wiring layer 110, the first insulating layer 130 and the second insulating layer 150 are opened, and the first conductive layer 160 is electrically connected to the first wiring layer 110 via the openings of the first insulating layer 130 and the second insulating layer 150. On the second wiring layer 120, the first insulating layer 130 is opened, and the second conductive layer 140 is electrically connected to the second wiring layer 120 via the opening of the first insulating layer 130.

On the second insulating layer 150 and the first conductive layer 160, the interlayer insulating layer 170 including the openings is provided. The first connection electrode 180 is provided in the openings of the interlayer insulating layer 170. The first connection electrode 180 is electrically connected to the first conductive layer 160 via the openings of the interlayer insulating layer 170. On the first connection electrode 180, the metal layer 190 is provided. The metal layer 190 is electrically connected to the first connection electrode 180. The light emitting element 200 is provided on the metal layer 190. The second connection electrode 210 is provided on the light emitting element 200. Although not shown, the second connection electrode 210 is electrically connected to the second wiring layer 120. The space between the interlayer insulating layer 170 and the second connection electrode 210 may be filled with an organic resin as a planarization layer 250.

The substrate 100 can support each layer on the substrate 100. For example, a flexible resin substrate such as a polyimide substrate, an acrylic substrate, a siloxane substrate, or a fluororesin substrate can be used as the substrate 100. In order to improve the heat resistance of the substrate 100, an impurity may be introduced into the flexible resin substrate. When the substrate 100 does not need to be transparent, impurities in which the transparency of the substrate 100 decreases may be introduced. On the other hand, when the substrate 100 does not need to be flexible, a rigid substrate having a light transmitting property such as a glass substrate, a silica substrate, or a sapphire substrate can be used as the substrate 100. Further, if the substrate 100 does not need to have light transmitting property, a silicon substrate, carbide silicon substrate, a semiconductor substrate such as a compound semiconductor substrate, or a conductive substrate such as a stainless substrate can be used as the substrate 100. As the substrate 100, a substrate having a surface on which an inorganic insulating film such as a silicon oxide film or a silicon nitride film is formed can also be used.

Metal materials can be used for each of the first wiring layer 110, the second wiring layer 120, the first conductive layer 160, the second conductive layer 140, and the first connection electrode 180. The metal material is, for example, copper (Cu), aluminum (Al), titanium (Ti), chromium (Cr), cobalt (Co), nickel (Ni), molybdenum (Mo), hafnium (Hf), tantalum (Ta), tungsten (W), bismuth (Bi), and alloys or compounds thereof, but are not limited thereto. The First wiring layer 110, the second wiring layer 120, the first conductive layer 160, the second conductive layer 140, or the first connection electrode 180 may have a structure in which the above metal material is stacked.

Each of the first insulating layer 130 and the second insulating layer 150 can be made of an insulating material. The insulating material is, for example, an inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxinitride ($AlO_xN_y$), aluminum nitride oxide ($AlN_xO_y$), or aluminum nitride ($AlN_x$), but is not limited to. $SiO_xN_y$ and $AlO_xN_y$ are silicon compound and aluminum compound containing nitrogen (N) in an amount smaller than that of oxygen (O). $SiN_xO_y$ and $AlN_xO_y$ are silicon compound and aluminum compound containing oxygen in an amount smaller than nitrogen. Each of the first insulating layer 130 and the second insulating layer 150 may use the organic insulating material as well as the inorganic insulating material. The organic insulating material is, for example, a resin such as a polyimide resin, an acrylic resin, an epoxy resin, a silicone resin, a fluororesin, or a siloxane resin, but not limited to. Each of the first insulating layer 130 and the second insulating layer 150 may have a structure in which the inorganic insulating material or the organic insulating material is used alone, or may have a structure in which the inorganic insulating material and the organic insulating material are stacked.

The interlayer insulating layer 170 can flatten the steps of the layers below the interlayer insulating layer 170. As a material of the interlayer insulating layer 170, for example, a photosensitive organic material such as a photosensitive acrylic resin or a photosensitive polyimide resin can be used. The interlayer insulating layer 170 may be the inorganic insulating material used in the first insulating layer 130 and the second insulating layer 150. The interlayer insulating layer 170 may have a stacked structure. For example, the interlayer insulating layer 170 may have a stacked structure of the photosensitive organic material and the inorganic insulating material, or a stacked structure of the organic insulating material and the inorganic insulating material.

The metal layer 190 can reflect light emitted from the light emitting element 200. The metal layer 190 has conductivity for electrically connecting an electrode of the light emitting element 200 and the first connection electrode 180. As the material of the metal layer 190, for example, a metal material having a high reflectivity such as aluminum (Al), silver (Ag), or platinum (Pt) is preferably used. The material of the metal layer 190 may also be the metal material used in the first wiring layer 110, the second wiring layer 120, the first conductive layer 160, the second conductive layer 140, and the first connection electrode 180.

Details of the configuration of the interlayer insulating layer 170 and the metal layer 190 are described later.

The light emitting element 200 is, for example, a light emitting diode (LED) or a laser diode (LD). The light emitting diode includes a mini LED or a micro LEDs.

The light emitting element 200 is provided in each pixel of the display device 10. Specifically, any one of a red light emitting element, a green light emitting element, and a blue light emitting element is provided in each pixel. By combining the red light emission of the red light emitting element, the green light emission of the green light emitting element, and the blue light emission of the blue light emitting element, the display device 10 can perform full-color display. The display device 10 using the light emitting element 200 of each pixel as a white light emitting element can also perform full-color display by extracting red light emission, green light emission, and blue light emission from the white light emission of the white light emitting element through the color filter. Further, the display device 10 using an ultraviolet light emitting element as the light emitting element 200 in each pixel can perform full-color display by converting an ultraviolet light emission of the ultraviolet light emitting element through the red phosphor, the green phosphor, and the blue phosphor and extracting the red light emission, the green light emission, and the blue light emission.

In the display device 10, the plurality of the light emitting elements 200 may be arranged in a matrix, or may be arranged in a staggered pattern or a striped pattern.

The structure of the light emitting element 200 is not limited to a vertical electrode structure in which the electrodes are placed in the direction perpendicular to. The structure of the light emitting element 200 may be a horizontal electrode structure in which electrodes are horizontally arranged. The light emitting element 200 shown in FIG. 1 has a vertical electrode structure, one of the electrodes of the light emitting element 200 is electrically connected to the metal layer 190, and the other of the electrodes of the light emitting element 200 is electrically connected to the second connection electrode 210.

The light emitting element 200 is provided on the metal layer 190. The metal layer 190 and the light emitting element 200 are bonded and are electrically connected to each other by a solder such as an alloy containing tin (Sn) or tin, a silver (Ag) paste, or a conductive material such as ACF.

The second connection electrode 210 can transmit light emitted from the light emitting element 200. The second connection electrode 210 preferably has high conductivity. As a material of the second connection electrode 210, for example, a transparent conductive oxide such as indium-tin oxide (ITO) or indium-zinc oxide (IZO) can be used.

Subsequently, referring to FIGS. 2A and 2B, the detailed configuration of the interlayer insulating layer 170 and the metal layer 190 in region where the light emitting element 200 is provided are described.

FIGS. 2A and 2B are schematic partial enlarged views and schematic plane view of the display device 10 according to an embodiment of the present invention. Specifically, the diagram 2A is a cross-sectional view obtained by the enlarging region 11 surrounded by the broken line shown in FIG. 1. FIG. 2B is a plane view corresponding to region 11 of FIG. 2A. In FIG. 2B, for convenience, the second connection electrode 210 on the light emitting element 200 is omitted.

As shown in FIG. 2A, the interlayer insulating layer 170, a plurality of first depressed portions 171 recessed from the upper surface of the interlayer insulating layer 170 is provided. The metal layer 190 is provided so as to cover the plurality of first depressed portion 171 of the interlayer insulating layer 170, and is provided with a plurality of second depressed portions 191 overlapping the plurality of first depressed portions 171. The metal layer 190 includes a first region 190-1 bonding to the light emitting element 200 and a second region 190-2 that is located on the outer side of the first region 190-1 and is provided with a plurality of second depressed portions 191. As shown in the FIG. 2B, a second region 190-2 provided with a second depressed portion 191 is provided so as to surround the first region 190-1.

The plurality of second depressed portions 191 of the metal layer 190 shown in FIG. 2B is arranged in a matrix so as to surround the light emitting element 200, but the arrangement of the plurality of second depressed portions 191 is not limited thereto. The plurality of second depressed portions 191 may be arranged in a staggered manner, for example. Further, the plurality of second depressed portions 191 may be randomly arranged.

When the plurality of second depressed portion 191 are regularly arranged in a matrix shape or a staggered shape, a pitch of the plurality of second depressed portions 191 (a distance between two adjacent second depressed portions) is 0.5 µm or more and 50 µm or less, and preferably 1 µm or more and 10 µm or less. The pitch of the plurality of second depressed portion 191 can also be reduced as the distance from the light emitting element 200 increases. That is, in the second region 190-2, the density of the second depressed portions 191 may be low in the region close to the light emitting element 200, and the density of the second depressed portions 191 may be high in the region away from the light emitting element 200. With such a configuration, the light emission efficiency is improved in the upper surface direction of the light emitting element 200.

A thickness of the metal layer 190 is, for example, 0.2 µm or more and 3 µm or less, preferably 0.5 µm or more and 2 µm or less, and more preferably 0.75 µm or more and 1.5 µm or less. A depth of the second depressed portion 191 (a distance from the top surface of the metal layer 190 to bottom surface of the second depressed portion 191) and an opening diameter of the second depressed portion 191 can be adjusted not only by the shape of the first depressed portion 171 of the interlayer insulating layer 170 but also the thickness of the metal layer 190. When the thickness of the metal layer 190 is small, the shape of the second depressed portion 191 is close to the shape of the first depressed portion 171. On the other hand, when the thickness of the metal layer 190 is large, the depth and the opening diameter of the second depressed portion 191 is small. The smaller the thickness of the metal layer 190, the higher resistance of the metal layer 190. On the other hand, when the thickness of the metal layer 190 is large, it takes time to form and process the metal layer 190, and thus the manufacturing tact of the display device 10 becomes long. Therefore, the thickness of the metal layer 190 is preferably in the above ranges.

The depth of the second depressed portion 191 is, for example, 0.2 µm or more and 10 µm or less. In addition, the depth of the second depressed portion 191 is preferably ½ or more of the thickness of the metal layer 190, and more preferably greater than the thickness of the metal layer 190. Further, the side surface of the second depressed portion 191 may have a taper. That is, the side surface of the second depressed portion 191 may not be perpendicular to the upper surface of the metal layer 190. The angle formed by the upper surface of the metal layer 190 and the side surface of the second depressed portion 191 is, for example, 20 degrees or more and 90 degrees or less, preferably 30 degrees or more and 80 degrees or less, more preferably 30 degrees or more and 70 degrees or less.

Although the cross-sectional shape of the second depressed portion 191 shown in FIG. 2B is circular, the cross-sectional shape of the second depressed portion 191 is not limited thereto. The cross-sectional shape of the second depressed portion 191 can also be elliptical or polygonal. The opening diameter of the second depressed portion is 0.1 µm or more and 50 µm or less, preferably 1 µm or more and 10 µm or less.

FIG. 2C is a schematic partial enlarged view of the display device 10 according to an embodiment of the present invention. Specifically, FIG. 2C is a partially enlarged view showing the optical path of the emission from the light emitting element 200 and the reflection at the metal layer 190.

Emission from the light emitting element 200 includes not only the light L1 emitted from the upper surface, the light L2 emitted from the side surface. The light L2 emitted from the side surface is reflected by the metal layer 190 and travels toward the upper surface of the light emitting element 200. On the upper surface of the metal layer 190, reflections occur in which the incident angle and the reflection angle of the light are equal. In the display device 10 according to the present embodiment, the second depressed portion 191 is provided in the metal layer 190 and the second depressed portion 191 can change the incident angle and the reflection angle. Specifically, the reflection angle can be made larger than the incident angle by the second depressed portion 191 of the metal layer 190. Therefore, as compared with the metal layer 190 in which the second depressed portion 191 is not provided, the light L2 emitted from side surface is reflected by the second depressed portion 191 and the light L3 traveling toward the upper surface direction of the light emitting element 200 is increased. Therefore, in the display device 10, the light emission efficiency is improved in the upper surface direction of the light emitting element 200.

As described above, according to the display device 10 of the first embodiment, by the second depressed portion 191 is provided in the metal layer 190, the light emission efficiency is improved in the upper surface direction of the light emitting element 200 of the display device 10. In other words, since the second depressed portion 191 is provided in the metal layer 190, the display device 10 improves the light extraction efficiency from the display surface. In addition, since the second depressed portion 191 of the metal layer 190 is provided along the first depressed portion 171 of the interlayer insulating layer 170, the second depressed portion 191 can be formed without processing the metal layer 190. Therefore, the display device 10 is a display device with reduced cost.

The display device 10 may be modified in a variety of ways. Therefore, referring to the FIG. 3A to 5B, a display device 10A, a display device 10B, and a display device 10C which are modifications of the display device 10 are described. Hereinafter, descriptions of the same configuration as that of the display device 10 described above are omitted, and a configuration differing from that of the display device 10 are mainly described. The modifications of the display device 10 are not limited thereto.

[Modification 1]

Figure 3A:
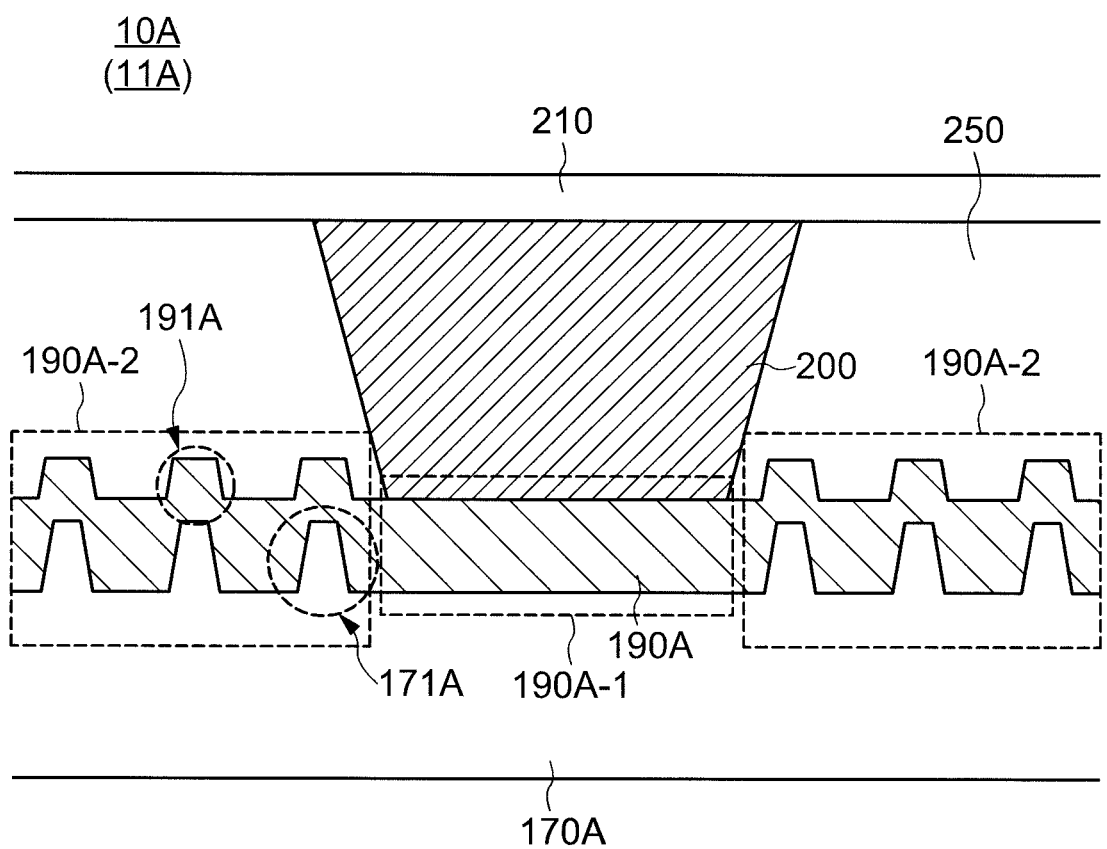
FIG. 3A is a schematic partial enlarged view of a display device according to an embodiment of the present invention.
Figure 3B:
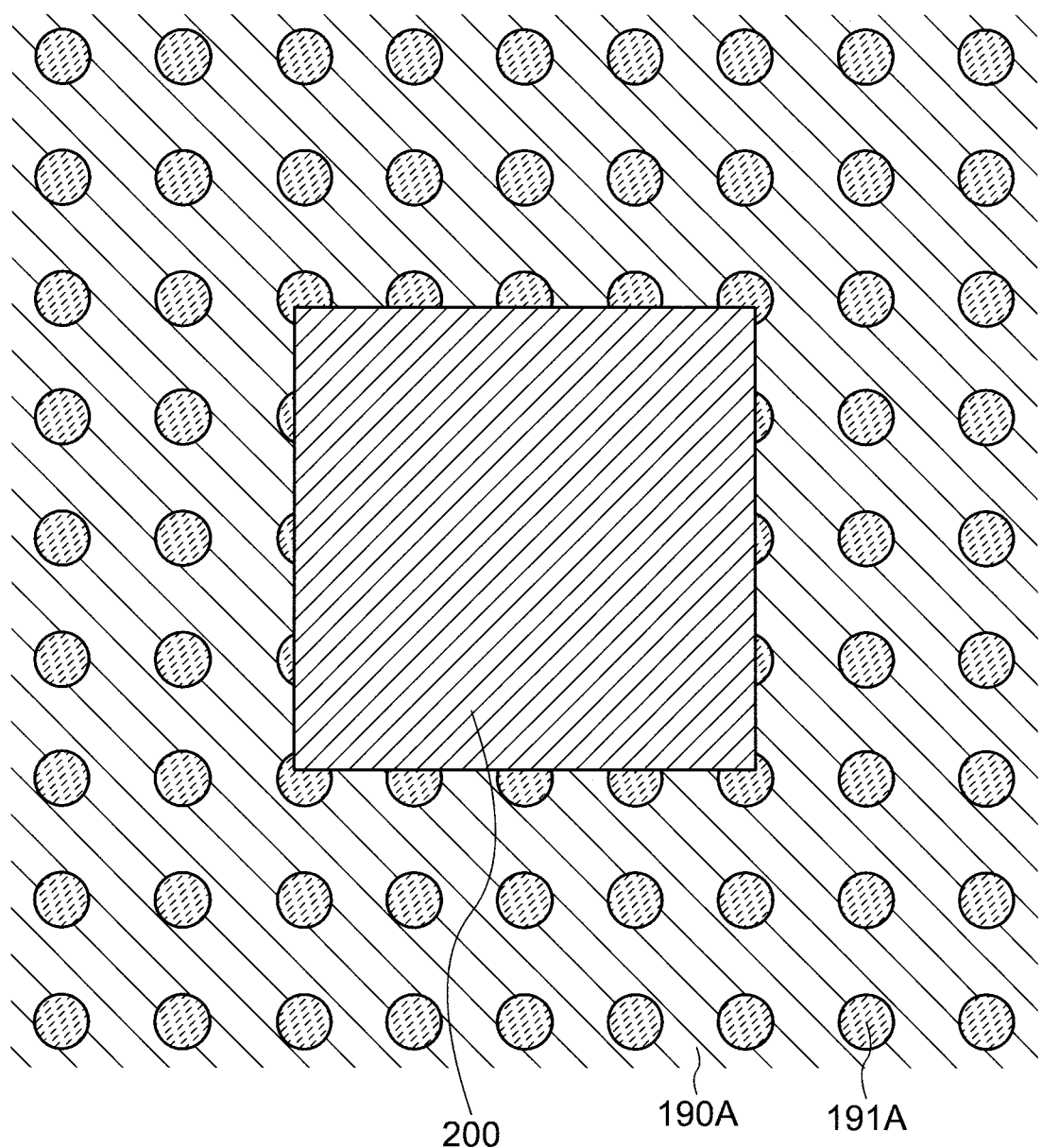
FIG. 3B is a schematic plane view of a display device according to an embodiment of the present invention.

FIGS. 3A and 3B are a schematic partial enlarged view and a schematic plane view of the display device 10A according to an embodiment of the present invention. Specifically, FIG. 3A is an enlarged cross-sectional view of a region 11A of the display device 10A corresponding to the region 11 surrounded by the broken line shown in FIG. 1 FIG. 3B is a plane view corresponding to the region 11A of FIG. 3A. In FIG. 3B, the second connection electrode 210 on the light emitting element 200 is omitted for convenience.

As shown in FIGS. 3A and 3B, the display device 10A includes a interlayer insulating layer 170A, a metal layer 190A, and the light emitting element 200. The interlayer insulating layer 170A is provided with a plurality of first projection portion 171A protruding from the upper surface of the interlayer insulating layer 170A. The metal layer 190A is provided so as to cover the plurality of first projection portions 171A of the interlayer insulating layer 170A, and is provided with a plurality of second projection portion 191A overlapping the plurality of first projection portions 171A. That is, the metal layer 190A includes a first region 190A-1 bonding to the light emitting element 200 and a second region 190A-2 that is located on the outer side of the first region 190A-1 and is provided with the plurality of second projection portions 191A. As shown in the FIG. 3B, the second region 190A-2 provided with the second projection portion 191A is provided so as to surround the first region 190A-1.

A height of the second projection portion 191A (a distance from the upper surface of the metal layer 190A to the upper surface of the second projection portion 191A) is, for example, 0.2 µm or more and 10 µm or less. The height of the second projection portion 191A is preferably ½ or more of the thickness of the metal layer 190A, and more preferably greater than the thickness of the metal layer 190A. The side surface of the second projection portion 191A may have a taper. That is, the side surface of the second projection portion 191A may not be perpendicular to the upper surface of the metal layer 190A. The angle formed by the upper surface of the metal layer 190A and the side surface of the second projection portion 191A is, for example, 20 degrees or more and 90 degrees or less, preferably 30 degrees or more and 80 degrees or less, more preferably 40 degrees or more and 70 degrees or less.

The cross-sectional shape of the second projection portion 191A may be a circular shape, an elliptical shape, or a polygonal shape. The diameter (or the length of one side) of the second projection portion 191A is 0.1 µm or more and 50 µm or less, preferably 1 µm or more and 10 µm or less. Further, a pitch of the plurality of second projection portion 191A is 0.5 µm or more and 50 µm or less, preferably 1 µm or more and 10 µm or less.

The pitch of the plurality of second projection portion 191A can also be reduced as the distance from the light emitting element 200 increases. In other words, in the second region 190A-2, the density of the second projection portion 191A may be low in the region close to the light emitting element 200, and the density of the second projection portion 191A may be high in the region away from the light emitting element 200. With such a configuration, the light emission efficiency is improved in the upper surface direction of the light emitting element 200.

Further, the height of the plurality of the second projection portion can also be increased as the distance from the light emitting element 200 increase. With such a configuration, the light emission efficiency is further improved in the upper surface direction of the light emitting element 200.

Also in the display device 10A shown in FIGS. 3A and 3B, the light emitted from the side surface of the light emitting element 200 is reflected by the second projection portion 191A, and the light traveling toward the upper surface direction of the light emitting element 200 increases. Therefore, in the display device 10A, the light emission efficiency increases in the upper surface direction of the light emitting element 200.

As described above, according to the display device 10A of the first modification, by the second projection portion 191A is provided in the metal layer 190A, the light emission efficiency is improved in the upper surface direction of the light emitting element 200 of the display device 10A. In other words, since the second projection portion 191A is provided in the metal layer 190A, the display device 10A improves the light extraction efficiency from the display surface. In addition, since the second projection portion 191A of the metal layer 190A is provided along the first projection portion 171A of the interlayer insulating layer 170A, the second projection portion 191A can be formed without processing the metal layer 190A. Therefore, the display device 10A is a display device with reduced cost.

[Modification 2]

Figure 4A:
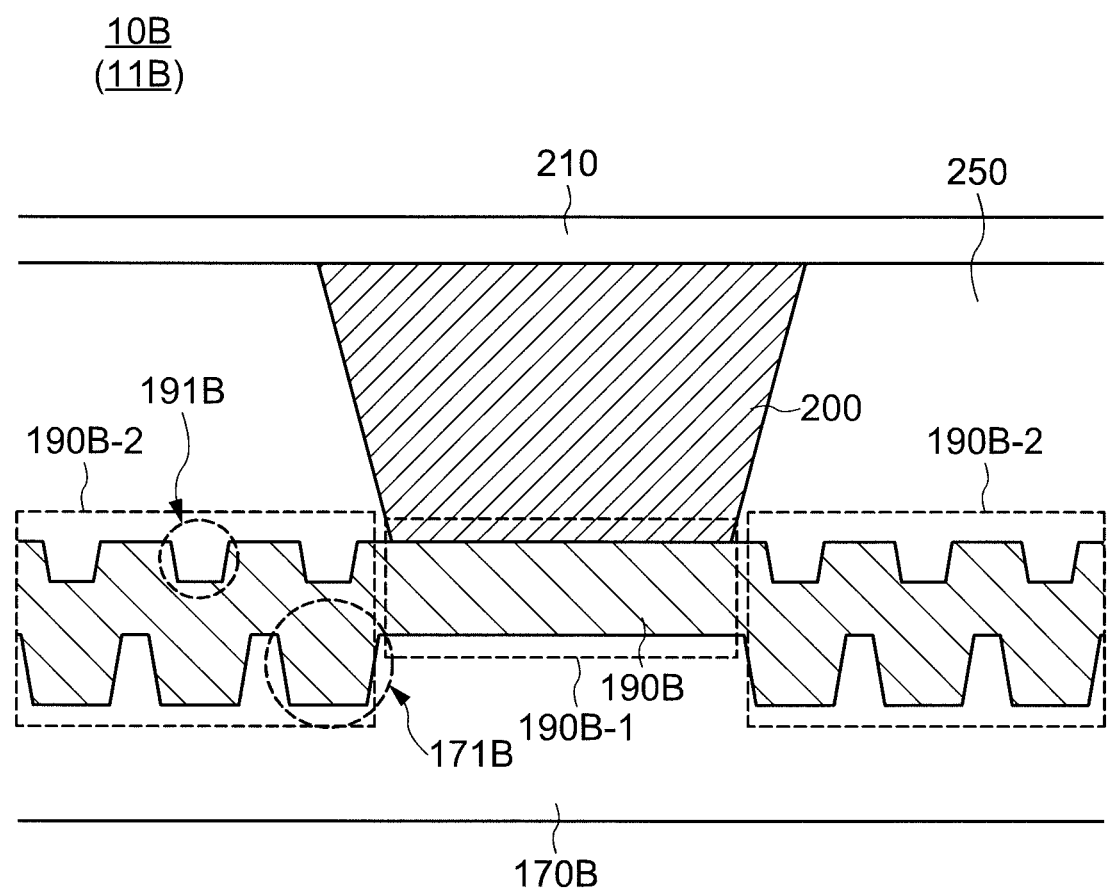
FIG. 4A is a schematic partial enlarged view of a display device according to an embodiment of the present invention.
Figure 4B:
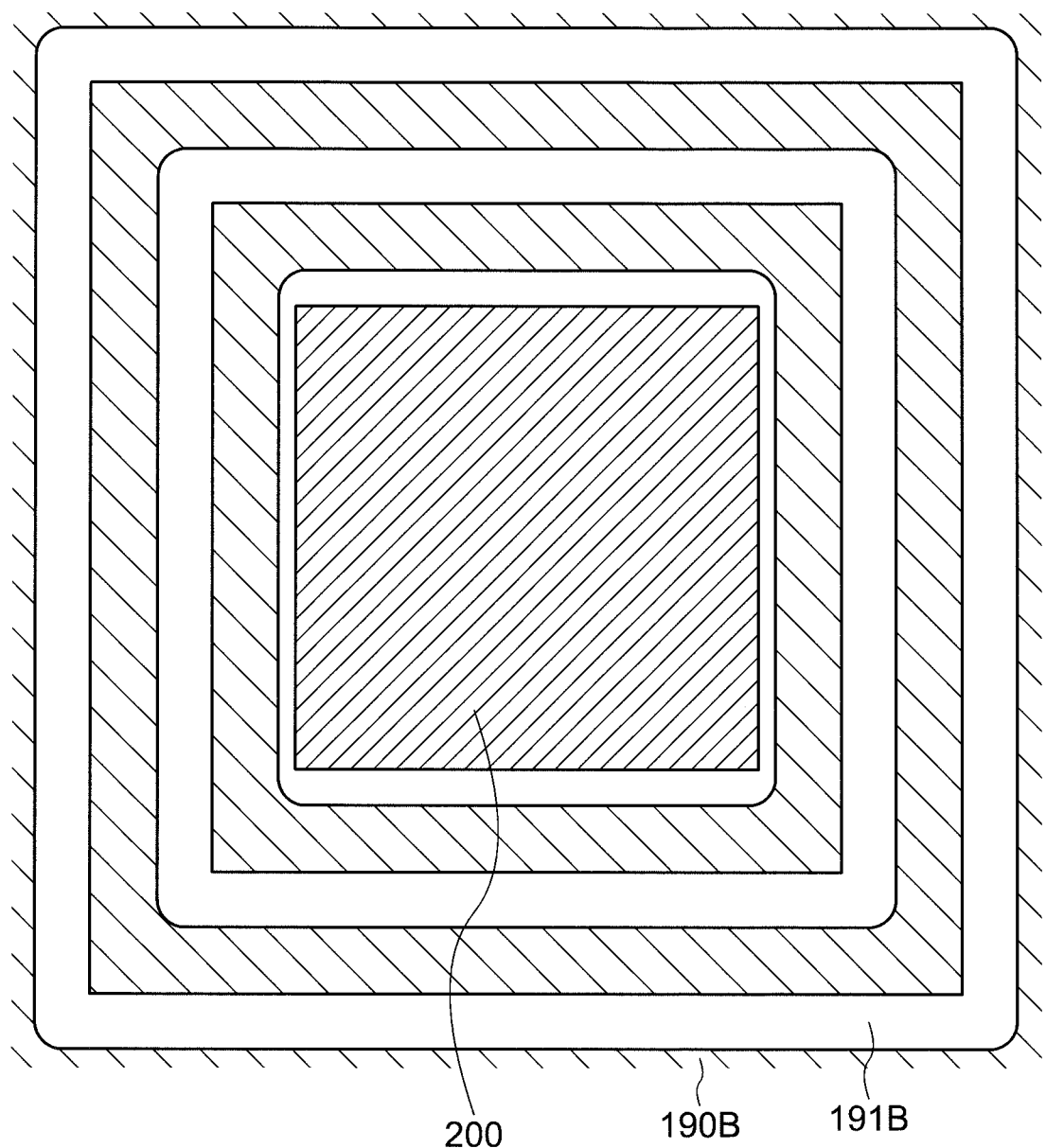
FIG. 4B is a schematic plane view of a display device according to an embodiment of the present invention.

FIGS. 4A and 4B are a schematic partial enlarged view and a schematic plane view of the display device 10B according to an embodiment of the present invention. Specifically, FIG. 4A is an enlarged cross-sectional view of a region 11B of the display device 10B corresponding to the region 11 surrounded by the broken line shown in FIG. 1 FIG. 4B is a plane view corresponding to the region 11B of FIG. 4A. In FIG. 4B, the second connection electrode 210 on the light emitting element 200 is omitted for convenience.

As shown in FIGS. 4A and 4B, a display device 10B includes a interlayer insulating layer 170B, a metal layer 190B, and the light emitting element 200. The interlayer insulating layer 170B is provided with a plurality of first grooves 171B recessed from the upper surface of the interlayer insulating layer 170B. The metal layer 190B is provided so as to cover the plurality of first grooves 171B of the interlayer insulating layer 170B, and is provided with a plurality of second grooves 191B overlapping the plurality of first grooves 171B. That is, the metal layer 190B includes a first region 190B-1 bonding to the light emitting element 200 and a second region 190B-2 that is located on the outer side of the first region 190B-1 and is provided with the plurality of the second groove 191B. As shown in the FIG. 4B, the second region 190B-2 provided with the second groove 191B is provided so as to surround the first region 190B-1.

A depth of the second groove 191B (a distance from the upper surface of the metal layer 190B to the bottom surface of the second groove 191B) is, for example, 0.2 µm or more 10 µm or less. The depth of the second groove 191B is preferably ½ or more of the thickness of the metal layer 190B, and more preferably greater than the thickness of the metal layer 190B. The side surface of the second groove 191B may have a taper. That is, the side surface of the second groove 191B may not be perpendicular to the upper surface of the metal layer 190B. The angle formed by the upper surface of the metal layer 190B and the side surface of the second groove 191B is, for example, 20 degrees or more and 90 degrees or less, preferably 30 degrees or more and 80 degrees or less, more preferably 40 degrees or more and 70 degrees or less.

The shape of the bottom surface of the second groove 191B may be a straight line or curved line, or may include a corner. The width of the second groove 191B is 0.1 µm or more and 50 µm or less, preferably 1 µm or more and 10 µm or less. Further, a pitch of the plurality of second grooves 191B is 0.5 µm or more and 50 µm or less, preferably 1 µm or more and 10 µm or less.

The pitch of the plurality of second grooves 191B can also be reduced as the distance from the light emitting element 200 increases. In other words, in the second region 190B-2, the density of the second groove 191B may be low in the region close to the light emitting element 200, and the density of the second groove 191B may be high in the region away from the light emitting element 200. With such a configuration, the light emission efficiency is improved in the upper surface direction of the light emitting element 200.

Also in the display device 10B shown in FIGS. 4A and 4B, the light emitted from the side surface of the light emitting element 200 is reflected by the second groove 191B, and the light traveling toward the upper surface direction of the light emitting element 200 increases. Therefore, in the display device 10B, the light emission efficiency increases in the upper surface direction of the light emitting element 200.

As described above, according to the display device 10B of the second modification, by the second groove 191B is provided in the metal layer 190B, the light emission efficiency is improved in the upper surface direction of the light emitting element 200 of the display device 10B. In other words, since the second groove 191B is provided in the metal layer 190B, the display device 10B improves the light extraction efficiency from the display surface. In addition, since the second groove 191B of the metal layer 190B is provided along the first groove 171B of the interlayer insulating layer 170B, the second groove 191B can be formed without processing the metal layer 190B. Therefore, the display device 10B is a display device with reduced cost.

[Modification 3]

Figure 5A:
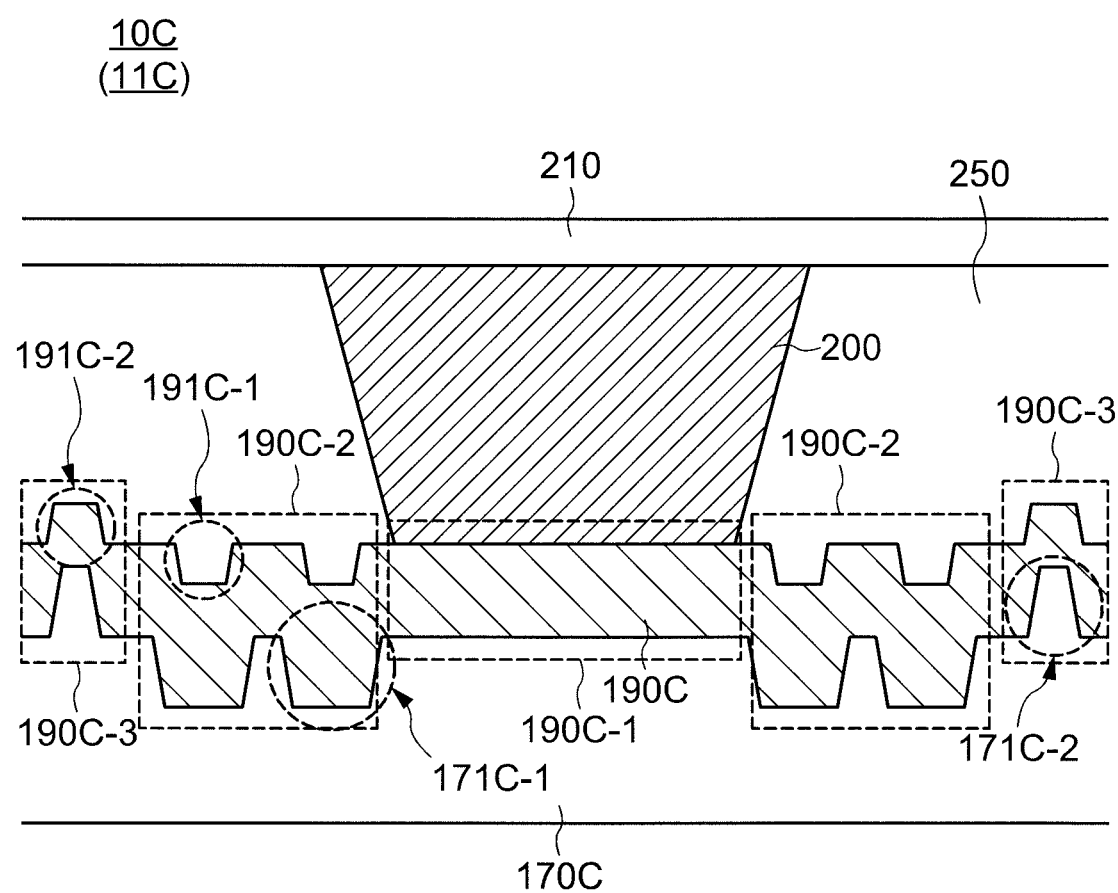
FIG. 5A is a schematic partial enlarged view of a display device according to an embodiment of the present invention.
Figure 5B:
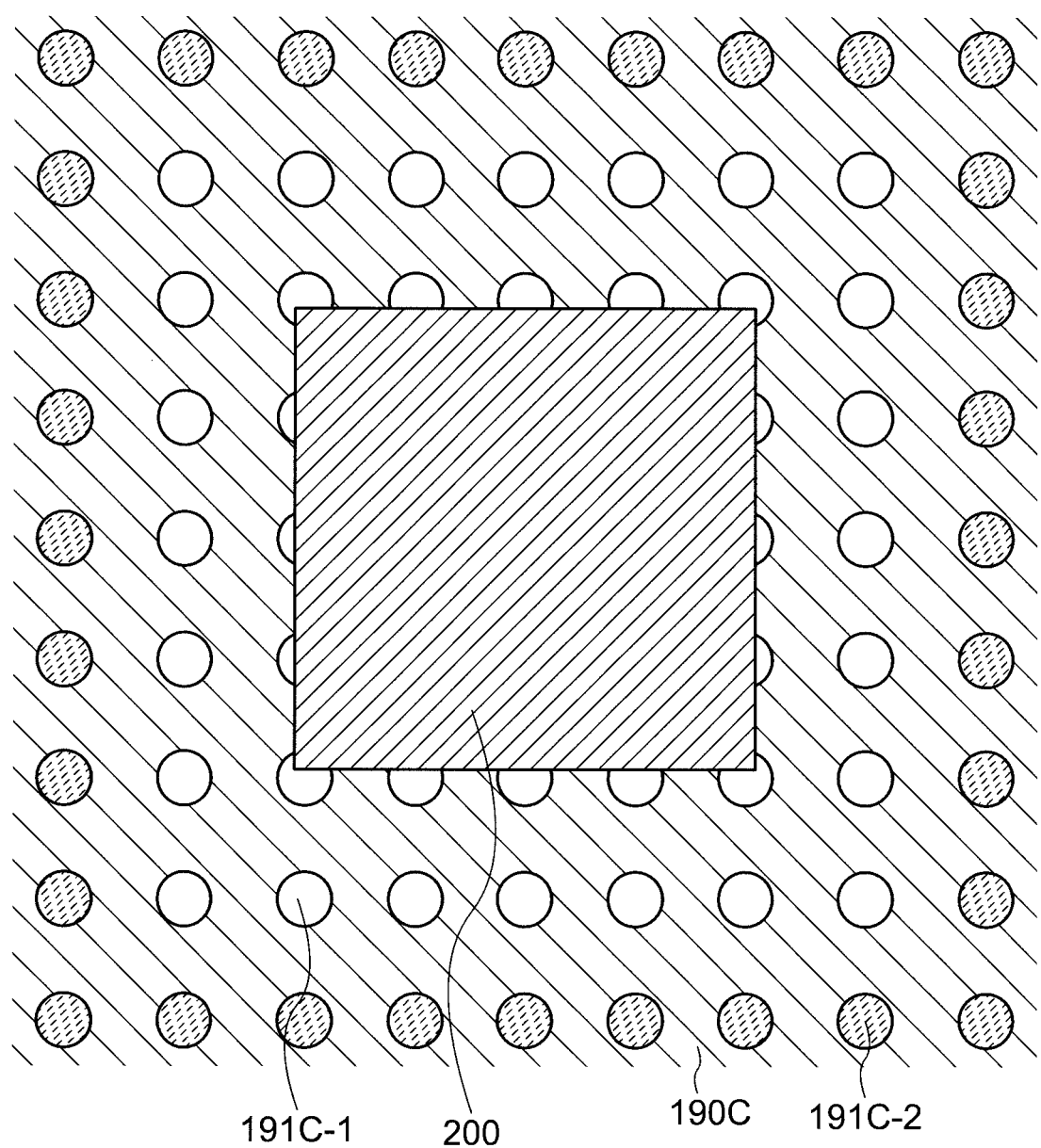
FIG. 5B is a schematic plane view of a display device according to an embodiment of the present invention.

FIGS. 5A and 5B are a schematic partial enlarged view and a schematic plane view of the display device 10C according to an embodiment of the present invention. Specifically, FIG. 5A is an enlarged cross-sectional view of a region 11C of the display device 10C corresponding to the region 11 surrounded by the broken line shown in FIG. 1. FIG. 5B is a plane view corresponding to the region 11C of FIG. 5A. In FIG. 5B, the second connection electrode 210 on the light emitting element 200 is omitted for convenience.

As shown in FIGS. 5A and 5B, the display device 10C includes a interlayer insulating layer 170C, a metal layer 190C, and the light emitting element 200. The interlayer insulating layer 170C is provided with a plurality of first depressed portions 171C recessed from the upper surface of the interlayer insulating layer 170C and a plurality of third projection portions 172C protruding from the upper surface of the interlayer insulating layer 170C. The metal layer 190C is provided so as to cover the plurality of first depressed portions 171C and the plurality of third projection portions 172C of the interlayer insulating layer 170C, and is provided with a plurality of second depressed portions 191C overlapping the plurality of first depressed portions 171C and a plurality of fourth projection portions 192C overlapping the plurality of third projection portions 172C. The metal layer 190C includes a first region 190 C-1 bonding to the light emitting element 200, a second region 190C-2 that is located on the outer side of the first region 190C-1 and is provided with the plurality of second depressed portions 191C, and a third region 190C-3 that is located on the outer side of the second region 190C-2 and is provided with the plurality of fourth projection portions 192C. As shown in the FIG. 5B, the second region 190C-2 provided with the second depressed portion 191C is provided so as to surround the first region 190C-1, and a third region 190C-3 provided with the fourth projection portion 192C is provided so as to surround the second region 190C-2.

A depth of the second depressed portion 191C and a height of the fourth projection portion 192C may be the same as the depth of the second depressed portion 191A and the height of the second projection portion 191A described above, respectively. Each of a side surface of the second depressed portion 191C and a side surface of the fourth projection portion 192C may have a taper. That is, the side surfaces of the second depressed portion 191C and the fourth projection portion 192C may not be perpendicular to the top surface of the metal layer 190C. The angle formed by the upper surface of the metal layer 190C and the side surface of the second depressed portion 191C or the side surface of the fourth projection portion 192C may be the same as that of the second depressed portion 191 or the second projection portion 191A described above, respectively.

The cross-sectional shape of the second depressed portion 191C and the cross-sectional shape of the fourth projection portion 192C may be the same as those of the second depressed portion 191 and the second projection portion 191A described above, respectively. The diameter of the opening of the second depressed portion 191C and the diameter of the fourth projection portion 192C may be the same as those of the second depressed portion 191 and the second projection portion 191A described above. Further, a pitch of the plurality of second depressed portion 191C and a pitch of the plurality of fourth projection portion 192C may be the same as those of the second depressed portion 191 and the second projection portion 191A described above, respectively. The pitch of the plurality of fourth projection portion 192C may be smaller than the pitch of the plurality of second depressed portion 191C.

Also in the display device 10C shown in FIGS. 5A and 5B, the light emitted from the side surface of the light emitting element 200 is reflected by the second depressed portion 191C and the fourth projection portion 192C, and the light traveling toward the upper surface direction of the light emitting element 200 increases. Therefore, in the display device 10C, the light emission efficiency increases in the upper surface direction of the light emitting element 200.

As described above, according to the display device 10C of the third modification, by the second depressed portion 191C and the fourth projection portion 192C are provided in the metal layer 190C, the light emission efficiency is improved in the upper surface of the light emitting element 200 of the display device 10C. In other words, since the second depressed portion 191C and the fourth projection portion 192C are provided in the metal layer 190C, the display device 10C improves the light extraction efficiency from the display surface. In addition, since the second depressed portion 191C and the fourth projection portion 192C of the metal layer 190C are provided along the first depressed portion 171C and the third projection portion 172C of the interlayer insulating layer 170C, respectively, the second depressed portion 191C and the fourth projection portion 192C can be formed without processing the metal layer 190C. Therefore, the display device 10C is a display device with reduced cost.

Second Embodiment

Referring to FIGS. 6A to 6E, a method for manufacturing the display device 10 according to an embodiment of the present invention are described.

FIGS. 6A to 6E are schematic partial enlarged views of the display device 10 at various steps of a method for manufacturing the display device 10 according to an embodiment of the present invention. Specifically, the FIGS. 6A to 6E show partial enlarged views of the region 11 surrounded by a broken line shown in FIG. 1 at each step of the manufacturing process. In FIGS. 6A to 6E, layers below the interlayer insulating layer 170 are omitted. The layers below the interlayer insulating layer 170 can be manufactured in a conventional manner.

Figure 6A:
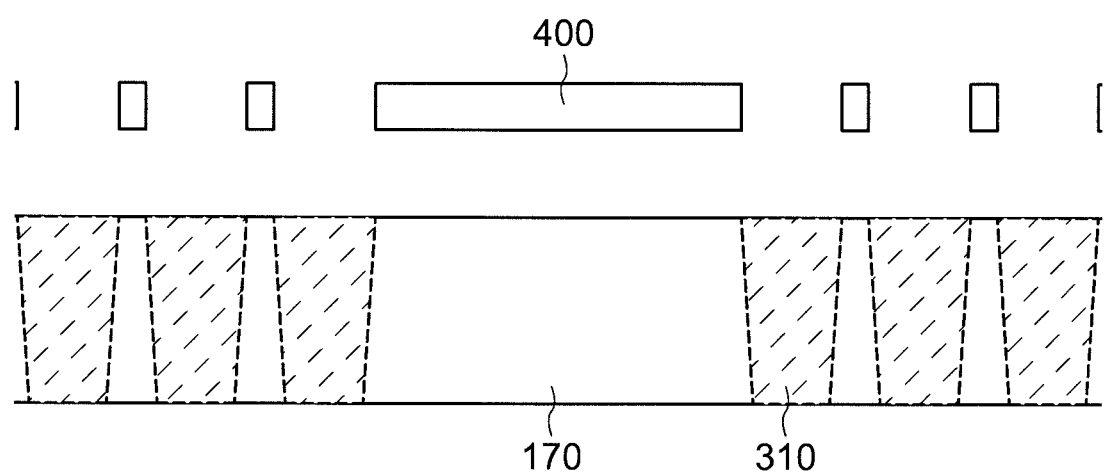
FIG. 6A is a schematic partial enlarged view of a display device in steps of a method of making a display device according to an embodiment of the present invention.
Figure 6B:
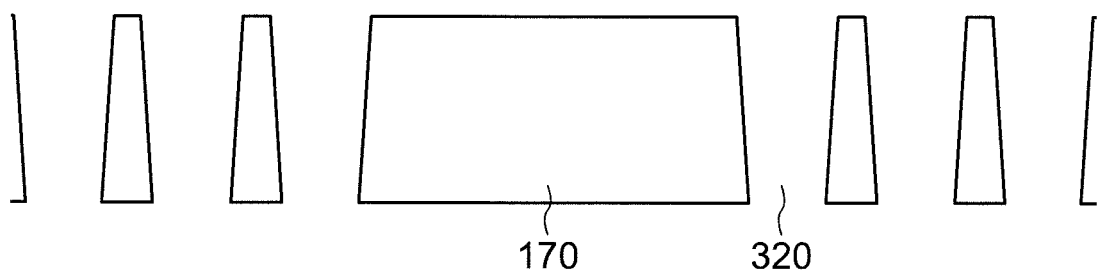
FIG. 6B is a schematic partial enlarged view of a display device in steps of a method of making a display device according to an embodiment of the present invention.
Figure 6C:
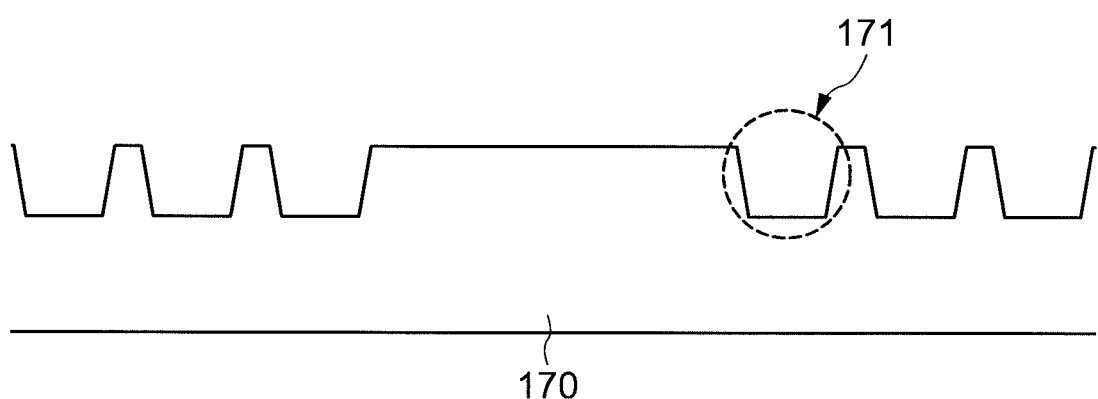
FIG. 6C is a schematic partial enlarged view of a display device in steps of a method of making a display device according to an embodiment of the present invention.
Figure 6D:
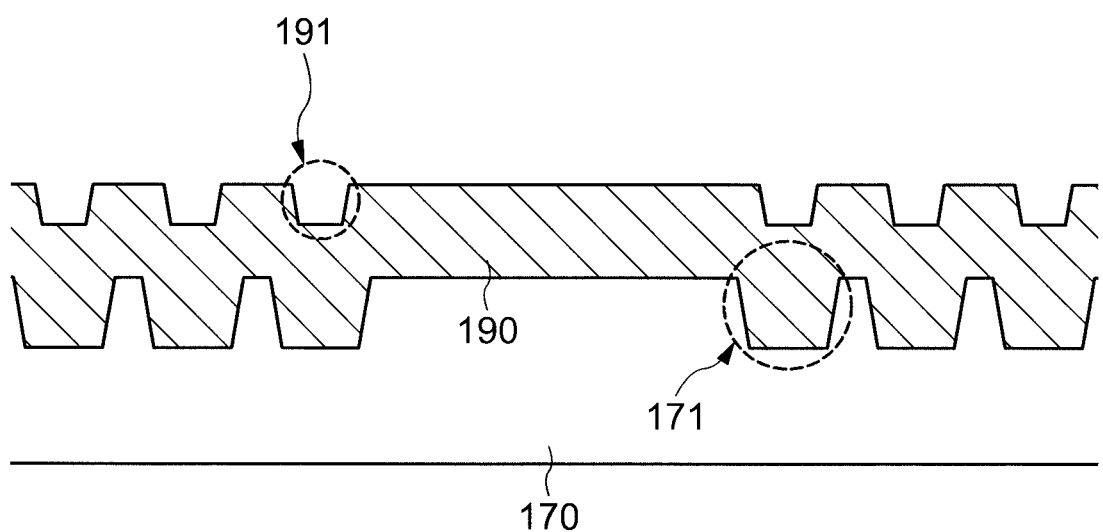
FIG. 6D is a schematic partial enlarged view of a display device in steps of a method of making a display device according to an embodiment of the present invention.
Figure 6E:
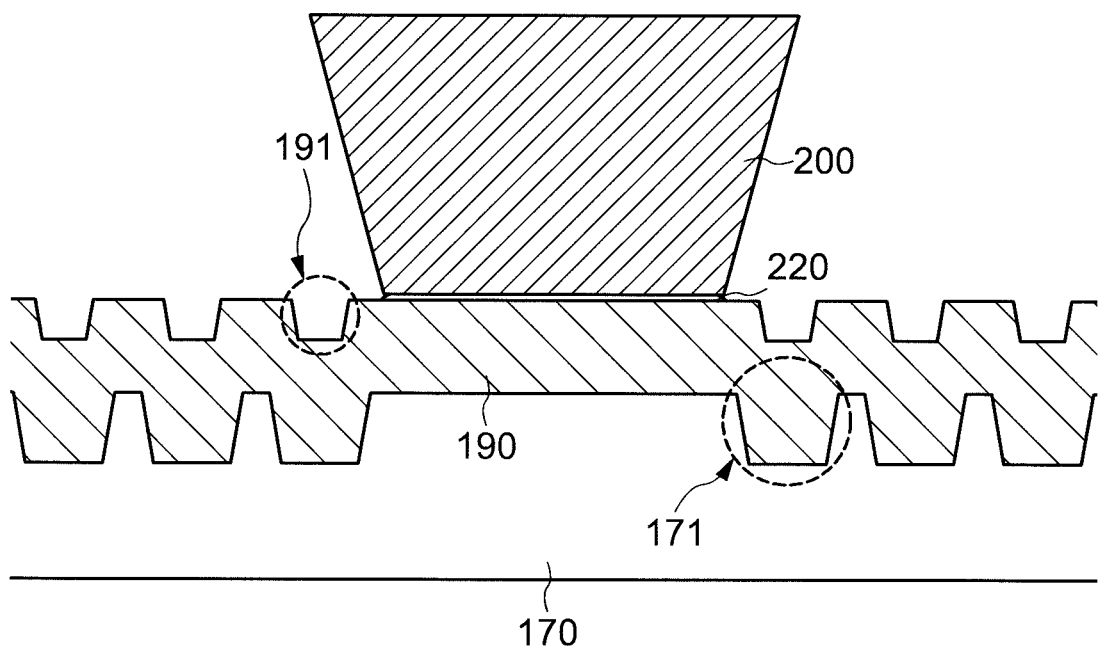
FIG. 6E is a schematic partial enlarged view of a display device in steps of a method of making a display device according to an embodiment of the present invention.

First, the interlayer insulating layer 170 is formed. As a material of the interlayer insulating layer 170, a photosensitive organic resin such as a photosensitive acrylic resin or a photosensitive polyimide resin can be used. The interlayer insulating layer 170 can be formed using a spin coating, slit coating, printing, or inkjet, or the like. Next, when exposure is performed using a photomask 400 as a mask, a portion 310 of the interlayer insulating layer 170 in which the photomask 400 is opened is exposed (FIG. 6A). Next, when the interlayer insulating layer 170 is developed, an opening 320 is formed in the exposed portion of the interlayer insulating layer 170 (FIG. 6B). Next, when the reflow treatment is performed by applying heat to the interlayer insulating layer 170, the bottom surface of the opening 320 is filled and the upper surface of the opening 320 is not filled, so that the first depressed portion 171 is formed in the interlayer insulating layer 170 (FIG. 6C). Next, the metal layer 190 is deposited. The metal layer 190 can be deposited using sputtering or CVD or the like. Since the metal layer 190 is deposited so as to cover the interlayer insulating layer 170 in which the first depressed portion 171 is formed, the metal layer 190 is formed with the second depressed portion 191 overlapping the first depressed portion 171 (FIG. 6D). Next, a bonding material 220 such as solder, silver paste, or ACF is applied on the first region 190-1 on which the second depressed portion 191 is not formed, and the light emitting element 200 is bonded (FIG. 6E). Heat treatment can be performed at the time of bonding.

Since the subsequent steps in the manufacturing of the display device 10 can be manufactured in a conventional manner, the descriptions are omitted here.

As described above, according to the manufacturing method of the display device 10 of the second embodiment, the first depressed portion 171 is formed in the interlayer insulating layer 170, and the metal layer 190 is formed so as to cover the first depressed portion 171, whereby the second depressed portion 191 can be formed in the metal layer 190. Therefore, the display device 10 including the second depressed portion 191 in the metal layer 190 can be manufactured without increasing costs.

The manufacturing method of the display device 10 may be modified in a variety of ways. Therefore, modifications of the manufacturing method of the display device 10 are described with reference to FIGS. 7A to 8B.

<Modification 1>

Figure 7A:
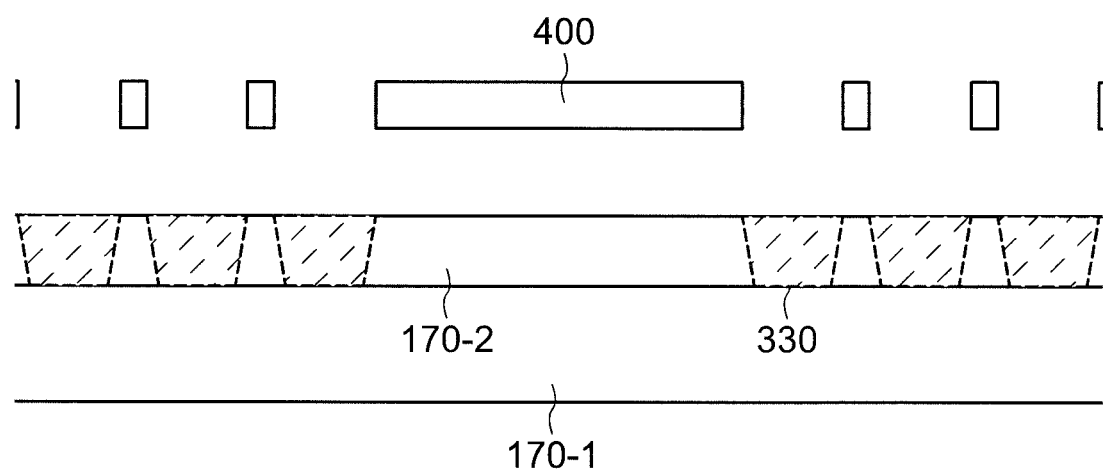
FIG. 7A is a schematic partial enlarged view of a display device in steps of a method of making a display device according to an embodiment of the present invention.
Figure 7B:
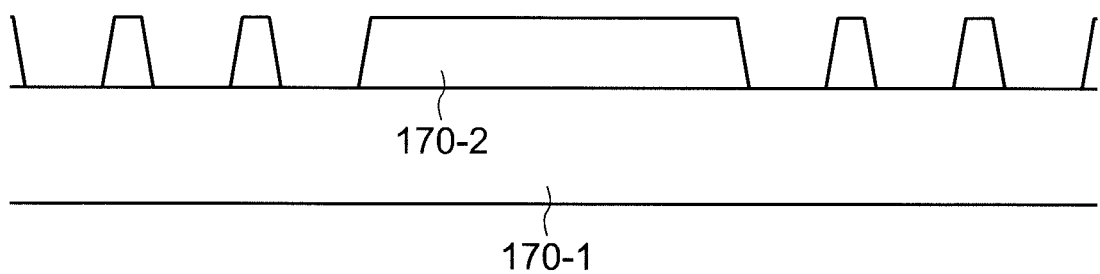
FIG. 7B is a schematic partial enlarged view of a display device in steps of a method of making a display device according to an embodiment of the present invention.
Figure 7C:
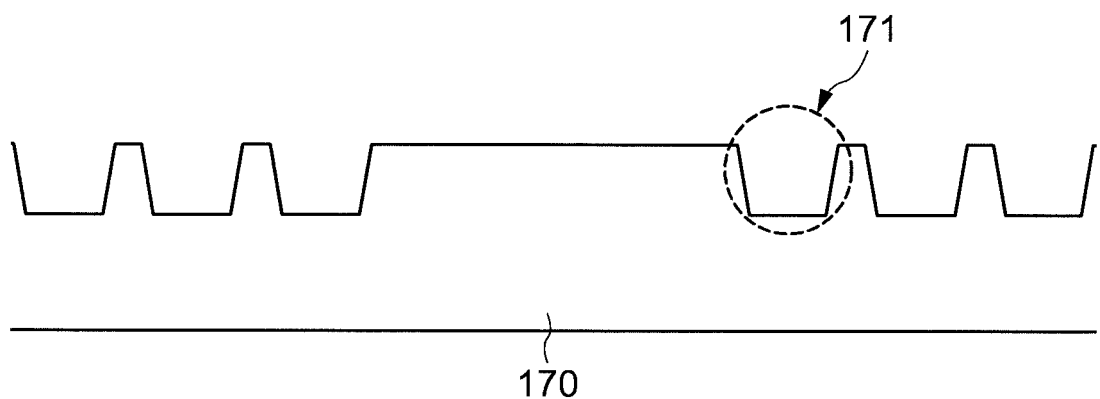
FIG. 7C is a schematic partial enlarged view of a display device in steps of a method of making a display device according to an embodiment of the present invention.

FIGS. 7A to 7C are schematic partial enlarged views of the display device 10 at each step of a method for manufacturing the display device 10 according to an embodiment of the present invention. Specifically, the FIGS. 7A to 7C show partial enlarged views of the region 11 surrounded by a broken line shown in FIG. 1 at each step of the manufacturing process. In FIGS. 7A to 7C, layers below the interlayer insulating layer 170 are omitted. The layers below the interlayer insulating layer 170 can be manufactured in a conventional manner.

First, a first interlayer insulating layer 170-1 and a second interlayer insulating layer 170-2 are formed. A material of the first interlayer insulating layer 170-1 may be an organic resin such as an acrylic resin or a polyimide resin, and a material of the second interlayer insulating layer may be a photosensitive organic resin such as a photosensitive acrylic resin or a photosensitive polyimide resin. The first interlayer insulating layer 170-1 and the second interlayer insulating layer 170-2 can be formed using a spin coating, slit coating, printing, or inkjet, or the like. Next, when exposure is performed using the photomask 400 as a mask, a portion 330 of the second interlayer insulating layer 170-2 in which the photomask 400 is opened is exposed (FIG. 7A). Next, when the second interlayer insulating layer 170-2 is developed, an opening 340 is formed in the exposed portion of the second interlayer insulating layer 170-2 (FIG. 7B). Next, heat is applied to the second interlayer insulating layer 170-2 to mix the materials at the interface between the first interlayer insulating layer 170-1 and the second interlayer insulating layer 170-2. The interlayer insulating layer 170 in which the first interlayer insulating layer 170-1 and the second interlayer insulating layer 170-2 are integrated is formed, and the first depressed portion 171 is formed in the interlayer insulating layer 170 (FIG. 7C).

Since the subsequent steps in the manufacturing of the display device 10 in the modification 1 are the same as those in the manufacturing method described above, the descriptions are omitted here.

As described above, according to the manufacturing method of the display device 10 of the first modification, since the opening diameter and the depth of the first depressed portion 171 are determined by the thickness of the second interlayer insulating layer 170-2, the opening diameter and the depth of the second depressed portion 191 of the metal layer 190 can be adjusted. Therefore, the second depressed portion 191 of the metal layer 190 is adjusted, and the display device 10 with controlled light extraction efficiency from the display surface can be manufactured.

<Modifications 2>

Figure 8A:
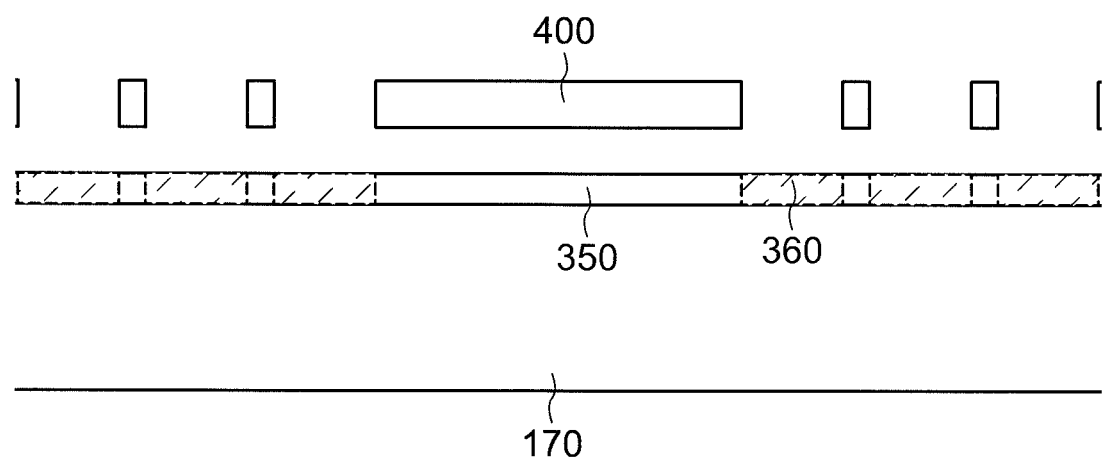
FIG. 8A is a schematic partial enlarged view of a display device in steps of a display device manufacturing process according to an embodiment of the present invention.
Figure 8B:
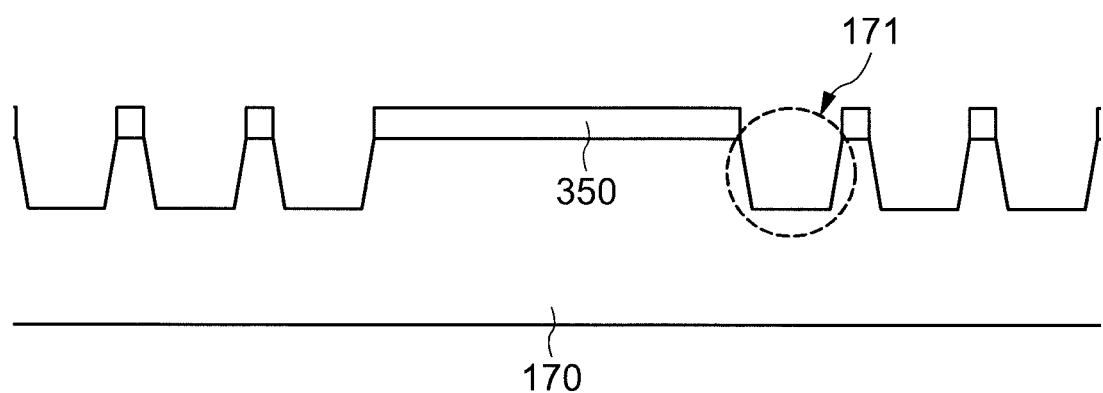
FIG. 8B is a schematic partial enlarged view of a display device in the steps of the process for making display device according to an embodiment of the present invention.

FIGS. 8A and 8B are schematic partial enlarged views of the display device 10 at each step of a method for manufacturing the display device 10 according to an embodiment of the present invention. Specifically, FIGS. 8A and 8B show partial enlarged views of the region 11 surrounded by a broken line shown in FIG. 1 at each step of the manufacturing process. In FIGS. 8A and 8B, layers below the interlayer insulating layer 170 are omitted. The layers below the interlayer insulating layer 170 can be made in a conventional manner.

First, the interlayer insulating layer 170 is formed. As the material of the interlayer insulating layer 170, the inorganic insulating material such as silicon oxide or silicon nitride can be used. The interlayer insulating layer 170 can be formed using sputtering or CVD or the like. Next, a photoresist 350 is coated on the interlayer insulating layer 170. Next, when exposure is performed using the photomask 400 as a mask, a portion 360 of the photoresist 350 in which the photomask 400 is opened is exposed (FIG. 8A). Although the photoresist 350 is described here as a positive resist, the photoresist 350 may be a negative resist. When the photoresist 350 is a negative resist, the exposed portion is left by developing, and thus the opening of the photomask for the negative resist is opposite to the opening of the photomask 400 shown in FIG. 8A.

Next, the photoresist 350 is developed. An opening is formed in the exposed portion 360 of the photoresist 350. The interlayer insulating layer 170 is then etched using the opening photoresist 350 as a mask. The etching may be wet etching, or may be dry etching. By etching the interlayer insulating layer 170, the first depressed portion 171 is formed in the interlayer insulating layer 170 (FIG. 8B). Next, the photoresist 350 is removed.

Since the subsequent steps in the manufacturing of the display device 10 of the modification 2 are the same as those in the manufacturing method described above, their descriptions are omitted here.

As described above, according to the manufacturing method of the display device 10 of the second modification, even if the interlayer insulating layer 170 is made of the inorganic insulating material, the first depressed portion 171 can be formed in the interlayer insulating layer 170 by photolithography. Since the second depressed portion 191 can be formed in the metal layer 190 by forming the metal layer 190 so as to cover the first depressed portion 171, the display device 10 including the second depressed portion 191 in the metal layer 190 can be manufactured without increasing costs.

Although the method of forming the first depressed portion 171 in the interlayer insulating layer 170 using photolithography are mainly described above, it is also possible to form the first depressed portion 171 in the interlayer insulating layer 170 using a mold.

Each of the embodiments described above as an embodiment of the present invention can be appropriately combined and implemented as long as they do not contradict each other. It is also within the scope of the present invention that a person skilled in the art adds, deletes, or changes designs of constituent elements, or adds, omits, or changes conditions of steps as appropriate based on a display device of the respective embodiments as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:

1. A display device comprising:
a substrate;
an interlayer insulating layer over the substrate;
a metal layer over the interlayer insulating layer; and
a light emitting element over the metal layer,
wherein the interlayer insulating layer comprises a plurality of first depressed portions,
wherein the metal layer comprises a first region having a flat surface and a second region surrounding the first region,
wherein the light emitting element is bonded to the flat surface,
wherein in the second region, a plurality of second depressed portions is provided along the plurality of first depressed portions, and
wherein a bottom surface of each of the plurality of first depressed portions is closer to the substrate than a bottom surface of the light emitting element,
wherein the interlayer insulating layer further comprises a plurality of first projection portions,
wherein the metal layer further comprises a third region surrounding the second region,
wherein in the third region, a plurality of second projection portions is provided along the plurality of first projection portions, and
wherein the plurality of second depressed portions has a smaller pitch as the plurality of second portions is farther away from the light emitting element.

2. The display device according to claim 1, wherein a material of the interlayer insulating layer is a photosensitive organic resin.

3. The display device according to claim 1, wherein a material of the interlayer insulating layer is an organic insulating material.

4. The display device according to claim 1, wherein the light emitting element comprises a micro LED.

5. A display device comprising:
a substrate;
an interlayer insulating layer over the substrate;
a metal layer over the interlayer insulating layer; and
a light emitting element over the metal layer,
wherein the interlayer insulating layer comprises a plurality of first projection portions,
wherein the metal layer comprises a first region having a flat surface and a second region surrounding the first region,
wherein the light emitting element is bonded to the flat surface,
wherein in the second region, a plurality of second projection portions is provided along the plurality of first projection portions,
wherein an upper surface of each of the plurality of first projection portions is closer to the substrate than a bottom surface of the light emitting element, and
wherein the plurality of second projection portions has a smaller pitch as the plurality of second projections is farther away from the light emitting element.

6. The display device according to claim 5, wherein the plurality of second projection portions are a greater height as the plurality of second projections is farther away from the light emitting element.

7. The display device according to claim 5, wherein a material of the interlayer insulating layer is a photosensitive organic resin.

8. The display device according to claim 5, wherein a material of the interlayer insulating layer is an organic insulating material.

9. The display device according to claim 5, wherein the light emitting element comprises a micro LED.

10. A display device comprising:
a substrate;
an interlayer insulating layer over the substrate;
a metal layer over the interlayer insulating layer; and
a light emitting element over the metal layer,
wherein the interlayer insulating layer comprises a plurality of first grooves,
wherein the metal layer comprises a first region having a flat surface and a second region surrounding the first region,
wherein the light emitting element is bonded to the flat surface,
wherein in the second region, a plurality of second grooves is provided along the plurality of first grooves, and
wherein a bottom surface of each of the plurality of first grooves is closer to the substrate than a bottom surface of the light emitting element,
wherein the plurality of second projection portions has a smaller pitch as the plurality of second projections is farther away from the light emitting element.

11. The display device according to claim 10, wherein the plurality of second grooves has a tapered side surface.

12. The display device according to claim 10, wherein a material of the interlayer insulating layer is a photosensitive organic resin.

13. The display device according to claim 10, wherein a material of the interlayer insulating layer is an organic insulating material.

14. The display device according to claim 10, wherein the light emitting element comprises a micro LED.

* * * * *